United States Patent [19]

McKeown

[11] 4,106,332

[45] Aug. 15, 1978

[54] RECORDING MONITOR FOR STRUCTURE FAULTS

[75] Inventor: William L. McKeown, Euless, Tex.

[73] Assignee: Textron, Inc., Providence, R.I.

[21] Appl. No.: 784,146

[22] Filed: Apr. 4, 1977

[51] Int. Cl.² ............................................. G08B 21/00
[52] U.S. Cl. ...................................... 73/104; 416/61;
                              340/27 R; 340/652; 340/679
[58] Field of Search ...................... 73/88.5 R, 91, 104;
                              340/256; 416/61

[56] References Cited

U.S. PATENT DOCUMENTS

| | | | |
|---|---|---|---|
| 3,596,269 | 7/1971 | Laska | 340/256 X |
| 3,633,196 | 1/1972 | Winkler et al. | 340/256 X |
| 3,779,071 | 12/1973 | Thomas, Jr. et al. | 73/88.5 R |
| 3,912,200 | 10/1975 | Foral | 416/61 X |
| 3,985,318 | 10/1976 | Dominey et al. | 116/70 X |
| 4,026,660 | 5/1977 | Veda et al. | 416/61 |

Primary Examiner—Charles A. Ruehl
Attorney, Agent, or Firm—Richards, Harris & Medlock

[57] ABSTRACT

A finger tip actuated structural crack monitor operation wherein a conductive array is adhered to a structure which is susceptible to development of cracks upon fatigue. An interrogation module is mounted on the structure and is connected to the array with circuit means in the module to sense any momentary discontinuity in the array and to store a failure condition therein upon detection of such discontinuity. A readout means is manually operated to provide a human sensible indication of the existence of the failure condition.

7 Claims, 6 Drawing Figures

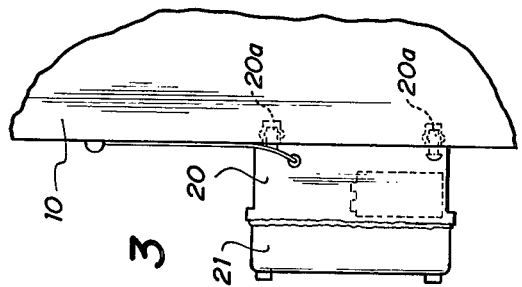
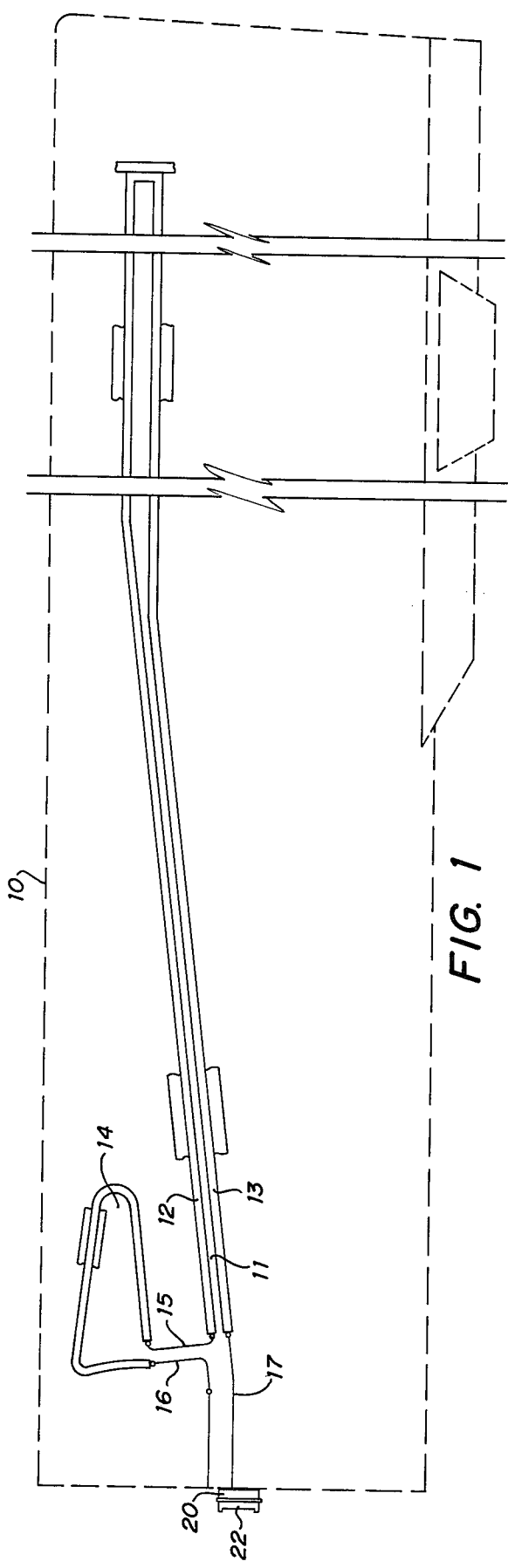
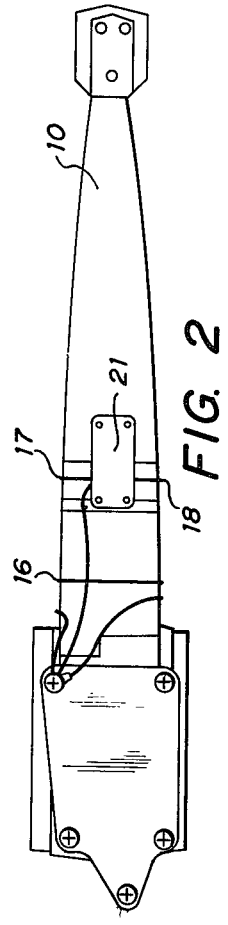
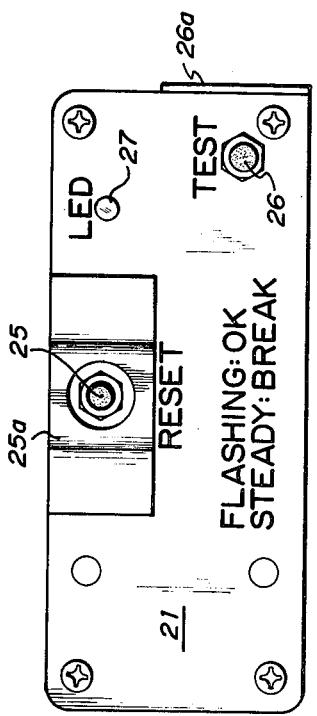

RECORDING MONITOR FOR STRUCTURE FAULTS

This invention relates to the detection of structural failures, such as cracks in vibrating structures such as helicopter blades and the like.

Aircraft structures, particularly helicopter rotor blades, are subject to repeated cycles of stress. Cracks in helicopter blades sometimes appear at varying times in blade life and represent the sites for progressive failure. Achieving certainty in inspection for and detection of cracks in such a structure has been found to be extremely difficult. It has heretofore been proposed to adhere conductive wires in or onto the surface of a stressed member and sense continuity in the electrical conductivity characteristic of wires. Cracks can be detected if the electrical conductor suffers a break or is severed.

While in flight, the rotor blades are under stresses not existing otherwise since their lift must support the helicopter. The flexure of the blades puts their top surfaces in compression while the bottom surfaces are in tension. When the helicopter is not in flight, the blades support themselves, in cantilever fashion, and their bottom surfaces are in compression. Depending on spanwise distance along the blades, their top surfaces are in much less tension than while in flight since centrifugal forces are no longer acting. A crack in a conductive circuit extending along the blade may close, making both visual inspection and static circuit checks unreliable means of crack detection. This results in the need for checking circuit continuity during flight. Through a radio link or slip ring the fact of a crack could be transmitted to the pilot during flight. Slip rings represent a costly means for retro-fit or production conditions. The radio link requires a transmitter on the rotor, along with a receiver in the aircraft. If an inflight warning to the pilot were desirable, the present invention would provide the signal to turn on such a transmitter as might be used. The combination would provide long battery life, and a single battery could provide the transmitter with power when needed while powering the crack detection circuit monitor.

The present invention provides an inexpensive and effective means for recording, electronically, the fact of a crack detection circuit interruption during flight, and a means for displaying this fact, using a simple test made when the helicopter is on the ground. Although the power required is extremely low, the test current used to check circuit continuity is high. The high test current is important to detecting cracks which have been contaminated with water. It is also important for the reduction of sensitivity to interference from electrostatic and electromagnetic sources.

The present invention is directed towards a system wherein an indication of a temporary discontinuity in an electrical path on a structure is caused to be stored for later interrogation so that reestablishment of conductivity, such as when a helicopter blade is at rest, will not result in failure to detect the presence of a crack which is opened when the underside of the blade is under tension.

In one aspect of the present invention, a self-contained battery operated circuit interrogates a conductive array on a structure subject to failure. The array is periodically interrogated at low energy level so that extended periods of operation can be assured.

Further in accordance with the invention, a crack detection system is provided for aircraft on structure having a normally conductive test circuit affixed to the structure and subject to being temporarily rendered noncontinuous under stresses and to regain continuity when stresses are removed. An oscillator periodically applies a search pulse to the test circuit and includes a visual indicator energized by current flow due to each pulse. A latch means is connected to the test circuit and is responsive to high voltage levels for setting a circuit condition therein. Test means utilizes the condition for actuating the oscillator to energize the indicator in a first sense responsive to the condition and in a second sense when the condition is not existent.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 is a plan view of a helicopter rotor blade to which test circuitry is applied;

FIG. 2 is an elevational view of the inboard end of the blade of FIG. 1;

FIG. 3 is an enlarged top view of the inboard end of the blade of FIGS. 1 and 2;

FIG. 4 is a front view of the detector unit assembly of FIG. 3;

Figure 5:
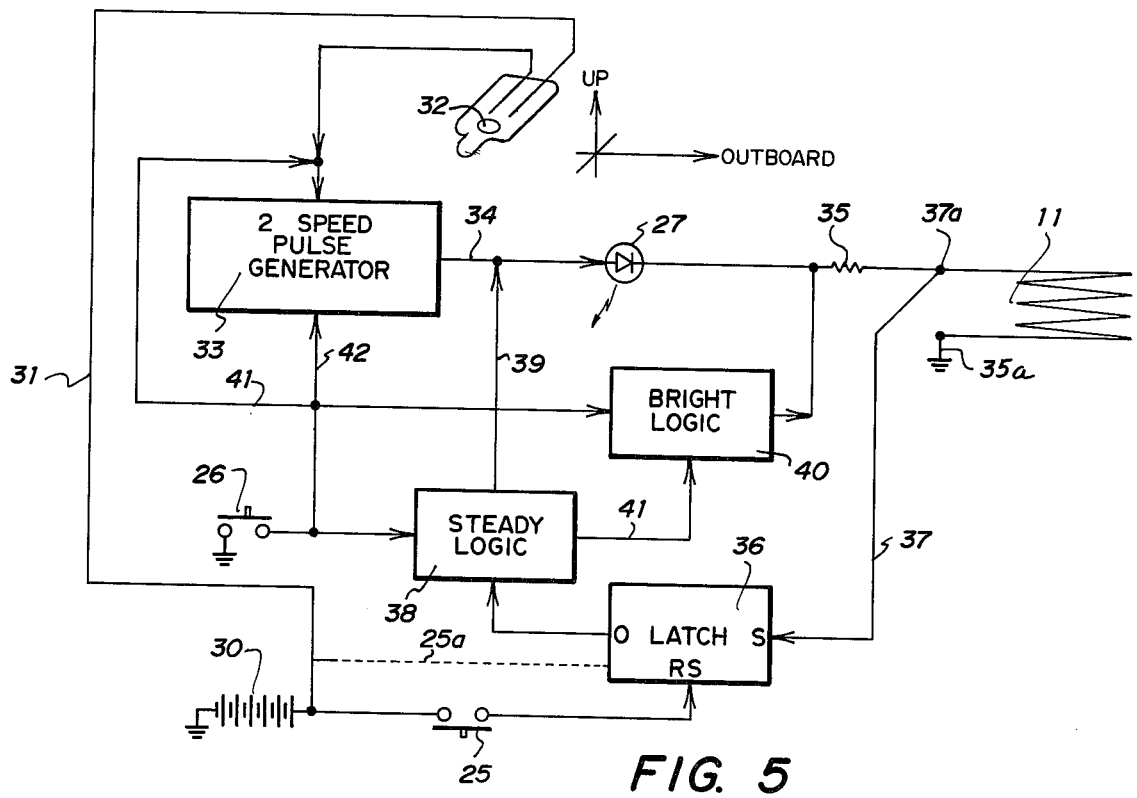
FIG. 5 is a block diagram of the circuitry involved in the detector unit assembly.

The present invention will be described in connection with a preferred embodiment thereof in which any crack developing in a helicopter blade is to be detected.

FIG. 1

In FIG. 1, a rotor blade 10 has a conductive loop 11 applied to the surface thereof. Loop 11 comprises legs 12 and 13. Loop 11 extends from near the inboard end of the blade to a point near the tip thereof. The legs 12 and 13 are shown spaced apart and are generally parallel. A second loop 14 is illustrated in FIG. 1, relatively short in length and located near the inboard end of the blade. The end of leg 12 is connected by way of a conductor 15 to one end of loop 14. The other end of loop 14 is connected by way of conductor 16 to an array on the underside of the blade. The conductive array (not shown) on the underside of the blade 10 may conform to the top array shown in FIG. 1. The end of leg 13 is connected by way of conductor 17 to a fitting assembly 20 mounted on the inboard end of blade 10. A detector unit assembly 22 is then mounted on the fitting assembly 20 and will be utilized as hereinafter described to check the continuity of the circuit comprised of loops 11, 14 and any loops on the opposite side of blade 10. As can be seen in FIG. 1, loops 11 and 14 are connected in series. One end of the series circuit is connected by conductor 17 to the fitting assembly 20. The other end is connected by way of conductor 16 to loops on the underside. The loops are all connected in series.

FIG. 2

As shown in FIG. 2, conductor 16 leads to one end of the series loops on the underside of blade 10 and conductor 18 leads from the other end of the series loops on the underside of blade 10 and is connected into the fitting assembly 20.

FIG. 3

In FIG. 3, the fitting assembly 20 is secured as by fasteners 20a to the flat inboard end of blade 10. The detector unit assembly 21 is a plug-in unit and comprises an interrogation and sensing circuit. As applied to blade 10, the sensing circuit is active only when the rotors are driven above a threshold r.p.m.

FIG. 4

In FIG. 4, a reset button 25, a test button 26 and a light emitting diode 27 are visible on the unit face. The reset button 25 is protected by a cover 25a through which a hole is provided. The reset button 25 is protected so that it cannot be inadvertently actuated. The test button 26 is positioned adjacent one end on which a protective plate 26a is mounted. The detector unit assembly 21 is connected through the fitting assembly 20 to the two terminals of the series circuit comprising loops 11, 14 and loops on the underside of blade 10. The detector unit assembly 21 is a battery powered unit designed to have low battery drain and is placed in operation when the blades are rotating periodically to sample the state of continuity of the series test loops and to store a condition any time the interrogation indicates an open circuit condition.

When the rotor blades are at rest, test button 26 may be depressed. In accordance with the system here employed, if an open circuit condition existed at any time during the flight anywhere in the series test loops, then the light emitting diode 27 will exhibit continuous excitation.

If no discontinuity existed in the course of the flight, then depression of the button 26 will result in diode 27 flashing intermittently.

FIG. 5

FIG. 5 is a block diagram showing the basic functional blocks of the detector unit assembly 21. In this system, long battery life is assured by keeping the test current high but only on a selected duty cycle. More particularly, a train of test pulses is generated characterized by long time intervals between pulses. The system is powered from a battery 30 which is connected by way of line 31 and a centrifugally operated mercury switch 32 to a two-speed pulse generator 33. The output of the pulse generator 33 is then applied by way of line 34, LED 27 and a resistor 35 to the series test loops. The other end of the series test loops is connected by way of conductor 35a to ground.

The series test loops are relatively low impedance and are connected in shunt relation to the input to a latch circuit 36. More particularly, the juncture between resistor 35 and the loops is connected by way of conductor 37. The output of the latch 36 is connected through a steady logic circuit 38 to conductor 34. When the impedance of the series test loops as viewed from point 37a is high (open circuit), then the pulse from generator 33 actuates the latch 36 to set the latch. Line 25a is shown dotted to indicate that when the aircraft is on the ground and the rotor is at rest, the latch 36 will be powered from battery 30 in order to retain memory of the latch 36 setting.

Thereafter, when test button 26 is depressed, the condition of the latch 36 will be sensed by the steady logic 38 and a constant voltage is applied by way of line 39 to diode 27 to maintain the diode in continuous excitation. The steady logic 38 also applies the control signal to a bright logic circuit 40 by way of line 41 so that the excitation of LED 27 will be at a much higher level than the level of excitation effective during flight. Closure of the test button 26 actuates the steady logic 38, the bright logic 40 and the pulse generator 33 by way of conductors 41 and 42, respectively. Control voltage on conductor 41 powers the generator 33 and on conductor 42, causes a change in the pulse rate from the relatively low rate during flight to a high rate during test.

In operation, switch 32 is oriented relative to the blade 10 to close by centrifugal force. In flight, the pulse generator 33 causes test current pulse of about 1 milliampere to pass through the LED 27 and a current limiting resistor 35 to the crack detection loops. The current pulse exists for a short time, for example about 0.25 second of the total period of the pulse generator of about 20 seconds. The duty cycle is therefore low, of the order of 0.0125. As a result, the drain on the battery is at a low level of about $12 \times 10^{-6}$ amperes.

As each pulse is generated, the test current is shunted away from the input to the latch 36 by the low impedance series test loops. If a break exists in the loops, the test pulse appears at the latch inputs at sufficient level to result in the latch output changing state. Thereafter, any opening or closing of the series test loops will have no affect on the latch output. Thus, the latch constitutes a memory.

At each flight end, a simple test can be made to determine whether or not the series test loops were or are broken at any point at any time. To initiate a test, switch 26 is closed. The logic circuits 38 and 40 then do several things. The first is that the test pulse generator 33 is reactivated, having been deactivated by the rotor stopping. The bright logic 40 is activated to cause current to flow through LED 27 sufficient to brighten it for use as a visual indicator. The steady logic 38 forces LED 27 to remain illuminated steadily in response to a latch output signal indicative of a present or past occurrence of an open loop circuit.

Assuming a crack was or is present, depression of the test button 26 operates functionally to test both the device and the series test loops. The action produced by the logic is to create a flashing light indication. LED 27 flashes at a reasonably high rate in response to a change in the pulse rate of generator 33 by closure of switch 26. It has been found that a test pulse duration of 0.025 second can be maintained but that the repetition rate increased to one pulse per second instead of one pulse per 20 seconds provides a readily identifiable flashing signal at the LED 27. LED 27 under flashing excitation provides visual evidence that the test pulse generator 33 is functionally good, that the battery 30, and the LED 27 are functionally good. Having observed the flashing light, the crack detection conductor circuit can be opened to confirm the functional integrity of the latch.

FIG. 6

Figure 6:
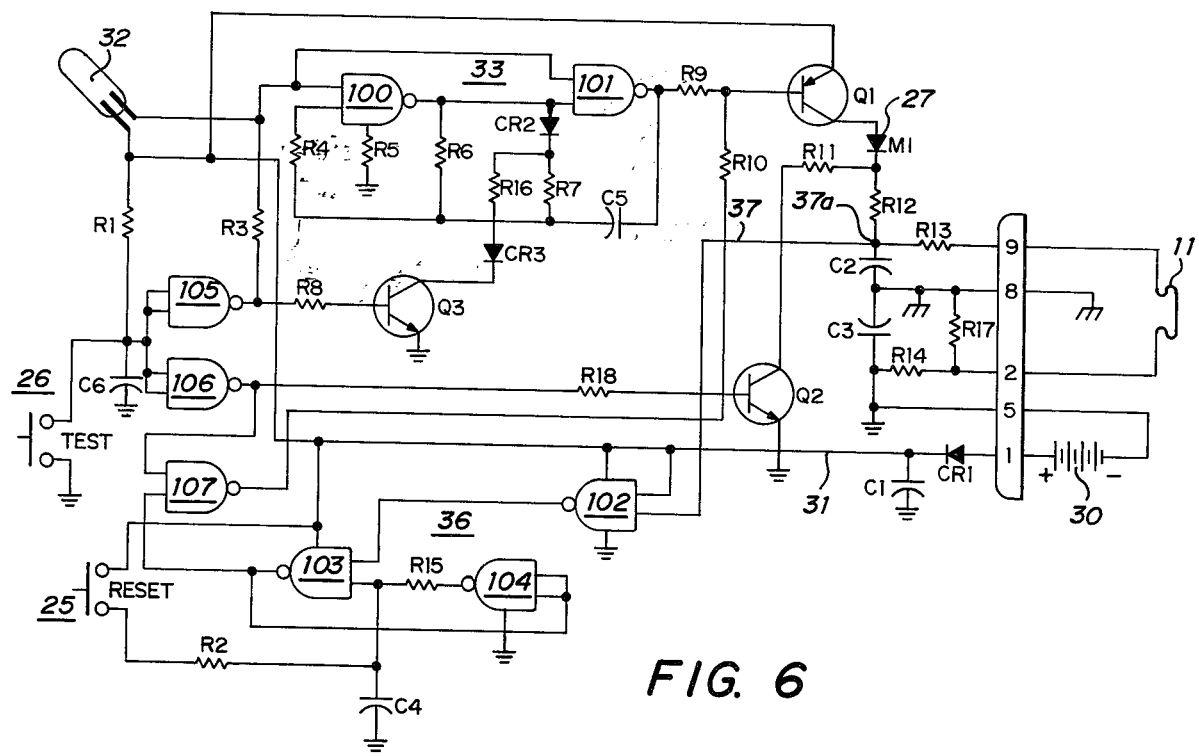
FIG. 6 is a detailed circuit diagram of the detector unit assembly.

Referring now to FIG. 6, a detailed schematic diagram of an embodiment of the invention has been shown. The circuitry is constructed around CMOS devices as are well known. They are used to perform the logic functions and the pulse generator functions. The circuit is powered by a 9 volt dry cell battery. The battery 30 can be housed in the fitting assembly 20 with the rest of the circuitry shown in FIG. 6 housed or potted in the detector unit assembly 21. The CMOS devices in the circuit of FIG. 6 are generally indentified as quad 2-input NAND gates.

Referring to FIG. 6, the circuit is powered from battery 30. While NAND gates 100-107 are all powered from battery 30, only two of the NAND gates, the gates 102 and 103 are shown connected to bus 31 leading from battery 30. The others are similarly connected to battery 30. Battery bus 31 extends to the mercury switch 32.

The NAND gates 100 and 101 are connected in a circuit to form a free running multivibrator. The output of NAND gate 101 is fed back through capacitor $C_5$ and resistor $R_4$ to the input of NAND gate 100. The circuit is a multivibrator circuit with the cyclic period of the multivibrator being controlled by capacitor $C_5$, resistances $R_4$, $R_5$, $R_6$, $R_7$, $R_{16}$, diodes $CR_2$, $CR_3$ and the on/off state of transistor $Q_3$. When transistor $Q_3$ is off, the test pulse generator 33 produces pulses every 20 seconds. When transistor $Q_3$ is on, test pulse generator 33 produces pulses once every second.

The output of the test pulse generator 33 is applied by way of resistor $R_9$ to the base of transistor $Q_1$ which drives the LED 27. The LED 27 is connected by way of resistances $R_{12}$ and $R_{13}$ to the test loops, the other terminal of which is connected by way of $R_{14}$ to ground. The juncture 37a between resistors $R_{12}$ and $R_{13}$ is connected by way of conductor 37 to an input of the latch which comprises NAND gates 102, 103 and 104. Gate 102 serves as a logic inverter. An open circuit in the test loops results in the output of gate 102 going to its low state. This low state is applied to a NAND gate 103. The two gates 103 and 104 comprise the latch by being connected as shown. A low state applied from gate 102 to gate 103 forces the output of gate 103 to its high state. This signal is applied to both inputs of gate 104 which gate is used as an inverter. A high state at the inputs of gate 104 results in a low state at the output thereof. Resistor $R_{15}$ is connected between the output of gate 104 and the second input of gate 103 and transfers a low state to the second input of gate 103. This input is slowed by capacitor $C_4$ for protection against interfering transients. A low state at the output of gate 102 results in a latch condition which cannot be negated except by reset action through switch 25 or by removal of the voltage of battery 30.

The resetting of the latch 36 through switch 25 must be accomplished while the helicopter is on the ground and would not normally be executed until after performing the test function.

Test switch 26 is connected in parallel with capacitor $C_6$ which is connected by way of resistor $R_1$ to the battery bus 31. When switch 26 is closed, the voltage at the inputs to the gates 105 and 106 is changed from high to low. Gates 105 and 106 operate as inverters and drivers to provide the necessary actions as will be described. The input terminals to gates 105 and 106 are normally held in a high state by the voltage from bus 31 through resistor $R_1$. Capacitor $C_6$ is an interference suppressing capacitor. When switch 26 is closed, the outputs of gates 105 and 106 change to the high state. The output of gate 105 is connected to drive the base of transistor $Q_3$ through resistance $R_8$ when high. The upper input terminals of gates 100 and 101 are also driven high through resistor $R_3$ when switch 26 is closed. This reactivates the pulse test generator 33 in spite of the mercury switch 32 being open. With transistor $Q_3$ turned on, an additional charging path for capacitor $C_5$ exists. The duty cycle of the pulse generator 33 is thus increased to result in a repetition rate which will provide rapid interrogation of the test loops and the flashing rate of the indicator lamp which is about once per second.

The test current alone is inadequate to provide visibility of the LED 27. Adequate current is drawn through resistor $R_{11}$ and transistor $Q_2$ during tests. Transistor $Q_2$ is turned on by a drive through resistor $R_{18}$ from the output of gate 106. If the test loop is open during flight, latch 36 will have been set. This results in a high state at the output of gate 103 which is connected to one input of NAND gate 107. This gate is used to force a steady state indication on the LED 27 when the latch is set and when test switch 26 is closed. The output of NAND gate 107 will be in its low state if the test switch 26 is closed. This will turn transistor $Q_1$ on steadily by way of resistor $R_{10}$.

An important feature in the operation of the system thus described is that the test unit checks the continuity of the test loops. If the latch 36 is reset, activation of the test function can show whether or not the crack closed up after flight. If not, a steady light will result after each reset action is taken.

The embodiment shown provides a very long battery life. While the helicopter is not in use, there is no current drain other than leakage through the CMOS devices. Typically, this amounts to about $10^{-7}$ amperes. The normal storage life of the battery would be the life limiting factor. In flight, the drain is typically $10^{-4}$ amperes. Thus, a relatively small battery can provide thousands of hours of flight.

The embodiment thus far described involves only one moving part, the globule of mercury in the switch 32. In the environment to be expected on a helicopter rotor blade, this is an important feature.

What is claimed is:

1. A crack detection system for aircraft structure having a normally conductive test circuit affixed to said structure and subject to being temporarily rendered noncontinuous under stress and to regaining continuity when stresses are removed which comprises:
   (a) an oscillator for periodically applying a search pulses to said test circuit and including a visual indicator energized by current flow due to each pulse,
   (b) latch means connected to said test circuit and responsive to high voltage levels for setting a circuit condition therein, and
   (c) test means for utilizing said condition for actuating said oscillator to energize said indicator in a first sense responsive to said condition and in a second sense when said condition is nonexistent.

2. The method of monitoring fatigue in helicopter rotor blades provided with normally continuous conductive test circuit means adhered to the blade surface which is subject to becoming at least momentarily noncontinuous during operation of said blade which comprises:
   (a) periodically applying a search pulse to said circuit at all times and blade is rotating above a threshold r.p.m., and
   (b) in response to sensing any noncontinuous condition in said circuit, storing a static signal in form retrievable when said blade comes to rest.

3. A battery powered low drain aircraft crack detection system which comprises:
   (a) an oscillator powered by said battery for generating long interval periodic low power search pulses, (b) a normally conductive low impedance series circuit connected at input terminals thereof to the output of said oscillator and comprising an elongated conductor means secured to a surface on said aircraft which is subject to transient openings of cracks therein during use thereof, (c) a latch connected to said circuit and responsive to any high impedance level at said input terminals during any said search pulse for setting a fault condition therein, and (d) means for selectively actuating said oscillator at a high rate high power mode to sense the existence of any such condition.

4. The combination set forth in claim 3 in which said surface is a helicopter blade with said elongated conductive means extending outboard from the inboard end of said blade with said battery, oscillator, and latch mounted at the inboard end of said blade for storing a condition indicative of momentary opening of said series circuit.

5. The combination set forth in claim 4 in which all of said system is mounted on the inboard end of said blade except said conductor means.

6. The combination set forth in claim 5 in which said high rate high power mode is initiated by a manually actuated push button switch at said inboard end.

7. The combination set forth in claim 3 in which a normally dormant optically sensed element is connected is series with the output of said oscillator and means are provided to render said element visible only in said high rate high power mode and when said condition is present.

* * * * *

UNITED STATES PATENT AND TRADEMARK OFFICE
CERTIFICATE OF CORRECTION

PATENT NO. : 4,106,332
DATED : August 15, 1978
INVENTOR(S) : William L. McKeown

It is certified that error appears in the above—identified patent and that said Letters Patent are hereby corrected as shown below:

Col. 6, line 43, change "pulses" to -- pulse --.
Col. 6, line 60, change "and" to -- said --.
Col. 8, line 13, change "is" to -- in --.

Signed and Sealed this

First Day of May 1979

[SEAL]

Attest:

RUTH C. MASON
Attesting Officer

DONALD W. BANNER
Commissioner of Patents and Trademarks